United States Patent
Lee et al.

(10) Patent No.: US 10,790,039 B1
(45) Date of Patent: Sep. 29, 2020

(54) SEMICONDUCTOR DEVICE HAVING A TEST CIRCUIT

(71) Applicant: MICRON TECHNOLOGY, INC., Boise, ID (US)

(72) Inventors: Hyunui Lee, Sagamihara (JP); Chiaki Dono, Chigasaki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/584,520

(22) Filed: Sep. 26, 2019

(51) Int. Cl.
| | |
|---|---|
| G11C 29/02 | (2006.01) |
| G11C 29/12 | (2006.01) |
| G11C 29/48 | (2006.01) |
| H01L 23/48 | (2006.01) |
| H01L 23/498 | (2006.01) |
| H01L 27/108 | (2006.01) |
| G11C 29/30 | (2006.01) |
| G11C 29/56 | (2006.01) |
| G11C 29/44 | (2006.01) |

(52) U.S. Cl.
CPC .......... *G11C 29/48* (2013.01); *G11C 29/022* (2013.01); *G11C 29/1201* (2013.01); *G11C 29/30* (2013.01); *G11C 29/56012* (2013.01); *G11C 29/56016* (2013.01); *H01L 23/481* (2013.01); *H01L 23/49816* (2013.01); *H01L 27/10897* (2013.01); *G11C 2029/4402* (2013.01)

(58) Field of Classification Search
CPC .................................. G11C 29/08; G11C 7/22
USPC ............................................. 365/189.05, 201
See application file for complete search history.

(56) References Cited

U.S. PATENT DOCUMENTS

| | | | | |
|---|---|---|---|---|
| 7,376,872 | B1* | 5/2008 | Nelson | G01R 31/318544 714/718 |
| 9,778,984 | B1* | 10/2017 | Plants | G11C 29/52 714/742 |
| 2001/0046167 | A1* | 11/2001 | Ayukawa | G11C 11/005 365/200 |
| 2002/0009006 | A1* | 1/2002 | Saitoh | G11C 29/48 365/201 |
| 2003/0043612 | A1* | 3/2003 | Ishikawa | G11C 29/1201 365/51 |
| 2004/0041579 | A1* | 3/2004 | Kim | G01R 31/31908 324/762.06 |
| 2004/0257847 | A1* | 12/2004 | Matsui | G11C 7/1051 365/63 |
| 2006/0282722 | A1* | 12/2006 | Co | G11C 29/56 714/724 |

(Continued)

*Primary Examiner* — Michael T Tran
(74) *Attorney, Agent, or Firm* — Dorsey & Whitney LLP

(57) ABSTRACT

Disclosed herein is an apparatus that includes a first semiconductor chip including a data I/O terminal, a test terminal, a first data input node, a first data output node, a read circuit, a write circuit, and a test circuit configured to transfer a test data supplied from the test terminal to the read circuit, and a second semiconductor chip including a second data input node connected to the first data output node, a second data output node connected to the first data input node, and a memory cell array. The test circuit is configured to activate the read circuit, the write circuit and the memory cell array so that the test data is written into the memory cell array via the read circuit, the data I/O terminal, the write circuit, the first data output node, and the second data input node.

20 Claims, 6 Drawing Sheets

(56) References Cited

U.S. PATENT DOCUMENTS

| | | | |
|---|---|---|---|
| 2007/0245200 A1* | 10/2007 | Hattori | G11C 29/16 714/742 |
| 2008/0126863 A1* | 5/2008 | Co | G11C 29/56 714/29 |
| 2008/0303173 A1* | 12/2008 | Hamada | G01R 31/318555 257/777 |
| 2009/0196093 A1* | 8/2009 | Happ | G11C 5/02 365/163 |
| 2009/0319802 A1* | 12/2009 | Walmsley | G06F 21/602 713/189 |
| 2010/0115270 A1* | 5/2010 | Silverbrook | G06Q 20/3829 713/159 |
| 2010/0325346 A1* | 12/2010 | Huang | G06F 13/4239 711/103 |
| 2010/0325498 A1* | 12/2010 | Nagadomi | G11C 16/32 714/724 |
| 2011/0089973 A1* | 4/2011 | Kondo | G11C 29/12 326/82 |
| 2012/0026811 A1* | 2/2012 | Aoki | G01R 31/318541 365/189.17 |
| 2012/0072790 A1* | 3/2012 | Burggraf, III | G11C 29/16 714/718 |
| 2012/0326146 A1* | 12/2012 | Hui | H01L 23/58 257/48 |
| 2015/0067388 A1* | 3/2015 | Xiao | G06F 11/1415 714/6.12 |
| 2016/0282409 A1* | 9/2016 | Nakamura | G11C 29/023 |
| 2017/0125119 A1* | 5/2017 | Loh | G11C 29/88 |
| 2017/0330860 A1* | 11/2017 | Shim | G11C 16/0483 |
| 2018/0158799 A1* | 6/2018 | Na | G11C 5/025 |
| 2019/0163570 A1* | 5/2019 | Kim | G11C 29/52 |
| 2019/0170819 A1* | 6/2019 | Friedman | G01R 31/318597 |
| 2019/0237152 A1* | 8/2019 | Lee | G11C 29/38 |

\* cited by examiner

SEMICONDUCTOR DEVICE HAVING A TEST CIRCUIT

BACKGROUND

A memory device called "HBM (High Bandwidth Memory)" has a configuration in which a plurality of memory core chips are stacked on an interface chip. At a manufacturing step of an HBM, an operation test in a state where the memory core chips are stacked on the interface chip is performed as well as an operation test for a unit of the interface chip or a unit of the memory core chips is performed. The operation test in the state where the memory core chips are stacked on the interface chip needs to be performed via an external terminal provided on the interface chip. However, the external terminal provided on the interface chip is quite small in size and probing thereto is difficult. Accordingly, a test terminal called "direct access terminal" is provided on the interface chip in addition to the general external terminal. A test data is input or output by connecting the direct access terminal to an external terminal provided on a package substrate and being greater in size. At the time of an operation test, an input/output circuit of the interface chip can be operated without the memory core chips being operated, or the memory core chips can be operated without the input/output circuit of the interface chip being operated, unlike a normal operation time.

However, when the input/output circuit of the interface chip is operated without the memory core chips being operated, no noise occurs from the memory core chips, which means that the input/output circuit of the interface chip is tested in different environments from those at the normal operation time. Similarly, when the memory core chips are operated without the input/output circuit of the interface chip being operated, no noise occurs from the input/output circuit of the interface chip, so that the memory core chips are tested in different environments from those at the normal operation time. Accordingly, a semiconductor device to which an operation test in same operating environments as those at the normal operation time can be performed in an operation test using the direct access terminal is demanded. It is also demanded that, when a test result indicates occurrence of a defect, a portion in which the defect occurs is separated.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
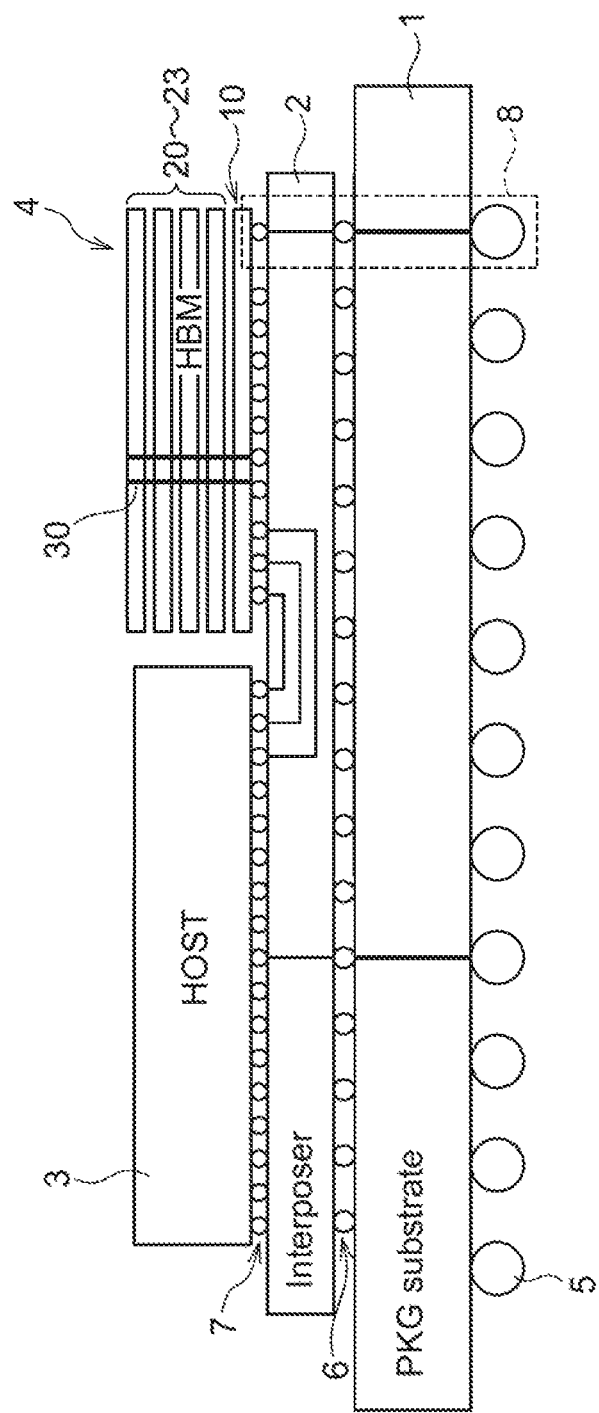
FIG. 1 is a schematic diagram showing a configuration of a semiconductor device according to the present disclosure.

As shown in FIG. 1, a semiconductor device according to the present disclosure includes a package substrate 1, an interposer 2 mounted on the package substrate 1, and a host controller 3 and an HBM 4 mounted on the interposer 2. The package substrate 1 is made of resin or the like and a plurality of bump electrodes 5 are provided on the back surface thereof. In a practical use, the bump electrodes 5 on the package substrate 1 are connected to a land pattern on a motherboard (not shown). The interposer 2 is made of silicon or the like and a plurality of bump electrodes 6 are provided on the back surface thereof. The interposer 2 has a function to connect the host controller 3 and the HBM 4 to each other and to connect the host controller 3 and the package substrate 1 to each other. The host controller 3 controls the HBM 4. The HBM 4 has a structure in which an interface chip 10 and a plurality of memory care chips 20 to 23 are stacked. While the four memory core chips 20 to 23 are stacked on the interface chip 10 in an example shown in FIG. 1, the number of stacked memory core chips is not particularly limited. The interface chip 10 and the memory core chips 20 to 23 are connected with TSVs (Through Silicon Vias) 30 provided to penetrate through semiconductor substrates. The host controller 3 and the HBM 4 are connected to the interposer 2 with microbumps 7. The size of the microbumps 7 is quite small. The HBM 4 includes a terminal called "direct access terminal". The direct access terminal provided on the HBM 4 is directly connected to a predetermined bump electrode 8 provided on the package substrate 1 without being connected to the host controller 3. Therefore, the HBM 4 can be directly accessed by probing to the bump electrode 8.

Figure 2:
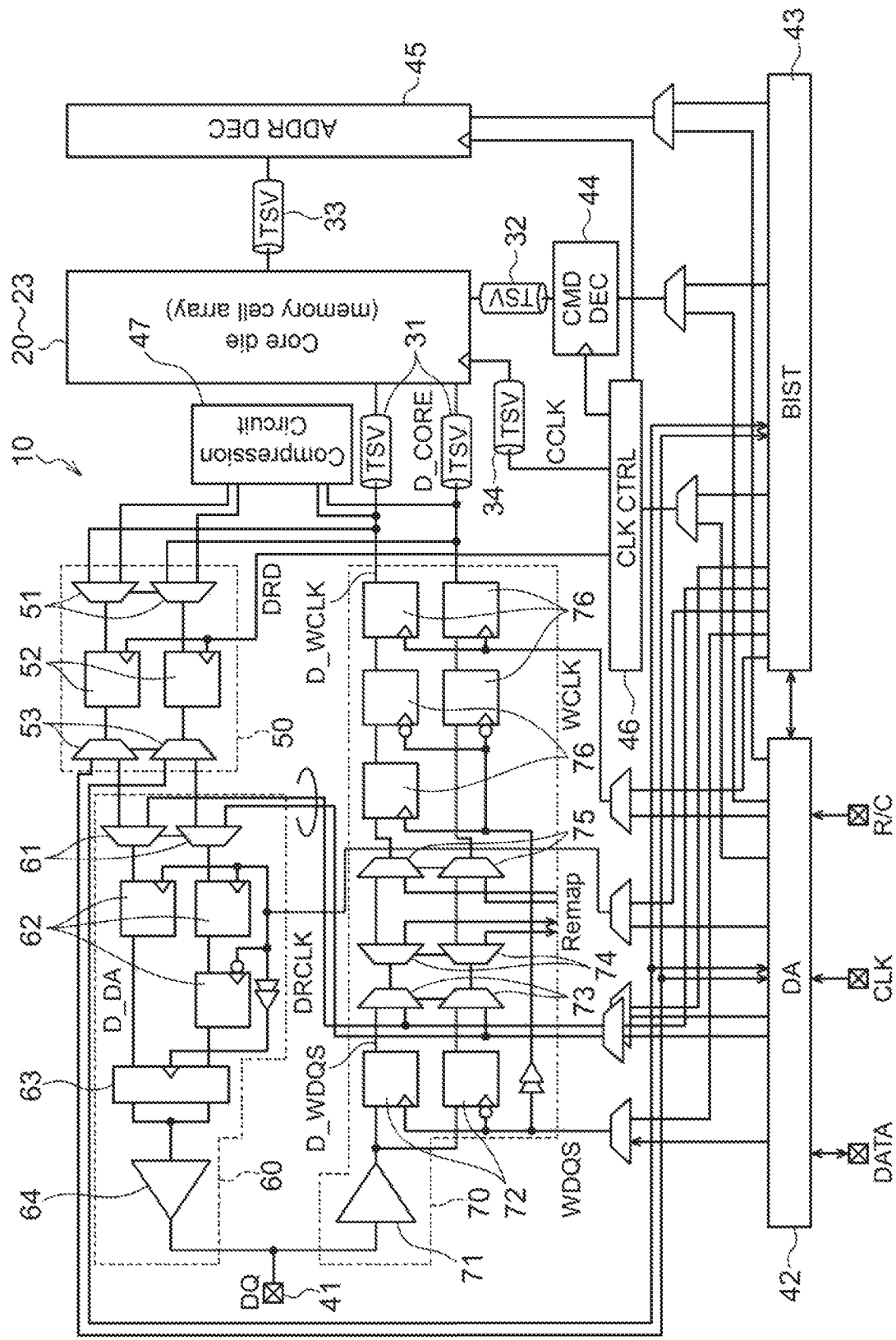
FIG. 2 is a circuit diagram of an interface chip included in an HBM.

As shown in FIG. 2, the interface chip 10 includes a direct access terminal 42 in addition to a data input/output terminal 41. The data input/output terminal 41 receives a read data DQ read from the memory core chips 20 to 23 and a write data DQ supplied from the host controller 3. The data input/output terminal 41 is connected to the host controller 3 via the interposer 2. In addition to the data input/output terminal 41, terminals such as an address terminal and a command terminal (both not shown) are also provided on the interface chip 10 and these terminals are also connected to the host controller 3 via the interposer 2. The direct access terminal 42 is a terminal connected directly to the bump electrode 8 shown in FIG. 1 and input/output of a test data DATA, input of a clock signal CLK, and input of an address command signal R/C are performed thereto. The test data DATA, the clock signal CLK, and the address command signal R/C input to the direct access terminal 42 are supplied to a BIST (Built-In Self Test) circuit 43. The BIST circuit 43 generates various signals required fix an operation test, such as an internal command and an internal address, on the basis of the test data DATA, the clock signal CLK, and the address command signal R/C input via the direct access terminal 42. The internal command generated by the BIST circuit 43 is supplied to a command decoder 44 and the internal address generated by the BIST circuit 43 is supplied to an address decoder 45. The command decoder 44 decodes the internal command and supplies a decoding result to the memory core chips 20 to 23 in synchronization with an internal clock signal generated by a clock control circuit 46. The address decoder 45 decodes the internal address and supplies a decoding result to the memory core chips 20 to 23 in synchronization with the internal clock signal generated by the clock control circuit 46. Clock signals DRCLK, WCLK, and WDQS are directly input from the direct access terminal 42 or the BIST circuit 43. The clock control circuit 46 outputs other clock signals DRD and CCLK, a clock signal for the command decoder 44, and a clock signal for the address decoder 45. Generation of the various clock signals by the clock control circuit 46 is performed on the basis of the clock signal CLK input via the direct access terminal 42 or the BIST circuit 43. The internal command or the internal address can be directly input via the direct access terminal 42 without being generated by the BIST circuit 43.

When a command signal, an address signal, and the clock signal CCLK are supplied from the interface chip 10 to the memory core chips 20 to 23, the memory core chips 20 to 23 perform a read operation or a write operation. A read data read from the memory core chips 20 to 23 is supplied to the interface chip 10 through TSVs 31. A write data to be written into the memory core chips 20 to 23 is supplied to the memory core chips 20 to 23 through TSVs 31. The command signal, the address signal, and the clock signal CCLK supplied from the interface chip 10 to the memory core chips 20 to 23 are also supplied to the memory core chips 20 to 23 through TSVs 32 to 34, respectively.

As shown in FIG. 2, the interface chip 10 includes a bypass circuit 50 and a read circuit 60 provided between the TSVs 31 and the data input/output terminal 41, and a write circuit 70 provided between the data input/output terminal 41 and the TSVs 31. The bypass circuit 50 includes selectors 51 and 53, and latch circuits 52. The selectors 51 supply one of a read data supplied from the TSVs 31 and a compression data supplied from a compression circuit 47 to the latch circuits 52. The latch circuits 52 latch the read data supplied from the selectors 51 in response to the clock signal DRD. The selectors 53 supply the read data supplied from the latch circuits 52 to the read circuit 60 or the direct access terminal 42 and the BIST circuit 43.

The read circuit 60 includes selectors 61 and 63, latch circuits 62, and an output driver 64. The selectors 61 supply one of the read data supplied from the bypass circuit 50 and a test data supplied from the direct access terminal 42 or the BIST circuit 43 to the latch circuits 62. The latch circuits 62 latch the read data or the test data supplied from the selectors 61 in response to the read clock signal DRCLK. As shown in FIG. 2, the latch circuits 62 have one of paths to which one stage is inserted and the other path to which two stages are inserted. Therefore, the read data or the test data transferred through the two paths have a time difference. The selector 63 alternately selects the parallel paths constituted by the latch circuits 62 in response to rising and falling of the read clock signal DRCLK to perform parallel-serial conversion of data. Accordingly, the serial data is supplied to the output driver 64. The output driver 64 drives the data input/output terminal 41 on the basis of the logical level of the data supplied from the selector 63.

The write circuit 70 includes an input receiver 71, latch circuits 72 and 76, and selectors 73 to 75. The input receiver 71 receives a write data DQ supplied to the data input/output terminal 41 and supplies the write data DQ to a pair of the latch circuits 72. One of the paired latch circuits 72 latches the output data from the input receiver 71 in synchronization with a rising edge of the strobe signal WDQS and the other of the paired latch circuits 72 latches the output data from the input receiver 71 in synchronization with a falling edge of the strobe signal WDQS. Accordingly, the serial data output from the input receiver 71 is converted into parallel data. A write data D WDQS output from the latch circuits 72 is supplied to the selectors 73. The selectors 73 receive the write data D WDQS and the test data supplied from the direct access terminal 42 or the BIST circuit 43 and supply either one of the data to the selectors 74. The selectors 74 supply the data supplied from the selectors 73 to the selectors 75 or remapped another terminal DQ or cell. The selectors 75 supply the data supplied from the selectors 74 or data supplied from remapped another terminal DQ or cell to the latch circuits 76. The latch circuits 76 include a previous stage portion operating in synchronization with a delayed strobe signal WDQS and a subsequent stage portion operating in synchronization with the write clock signal WCLK, and accordingly data in synchronization with the write clock signal WCLK is supplied to the memory core chips 20 to 23 through the TSVs 31.

A flow of data in a practical use is explained first. In a practical use, a write data DQ is input through the data input/output terminal 41 and a read data DQ is output through the data input/output terminal 41. At the time of a write operation, the write data DQ input to the data input/output terminal 41 is supplied to the memory core chips 20 to 23 via the write circuit 70 and the TSVs 31. The write data supplied to the memory core chips 20 to 23 is written into a memory cell array included in the memory core chips 20 to 23. Therefore, at the time of a write operation, the write circuit 70 and the memory core chips 20 to 23 are simultaneously activated. At the time of a read operation, the read data DQ read from the memory cell array included in the memory core chips 20 to 23 is supplied to the data input/output terminal 41 via the TSVs 31, the bypass circuit 50, and the read circuit 60. Accordingly, at the time of a read operation, the read circuit 60 and the memory core chips 20 to 23 are simultaneously activated.

Figure 3:
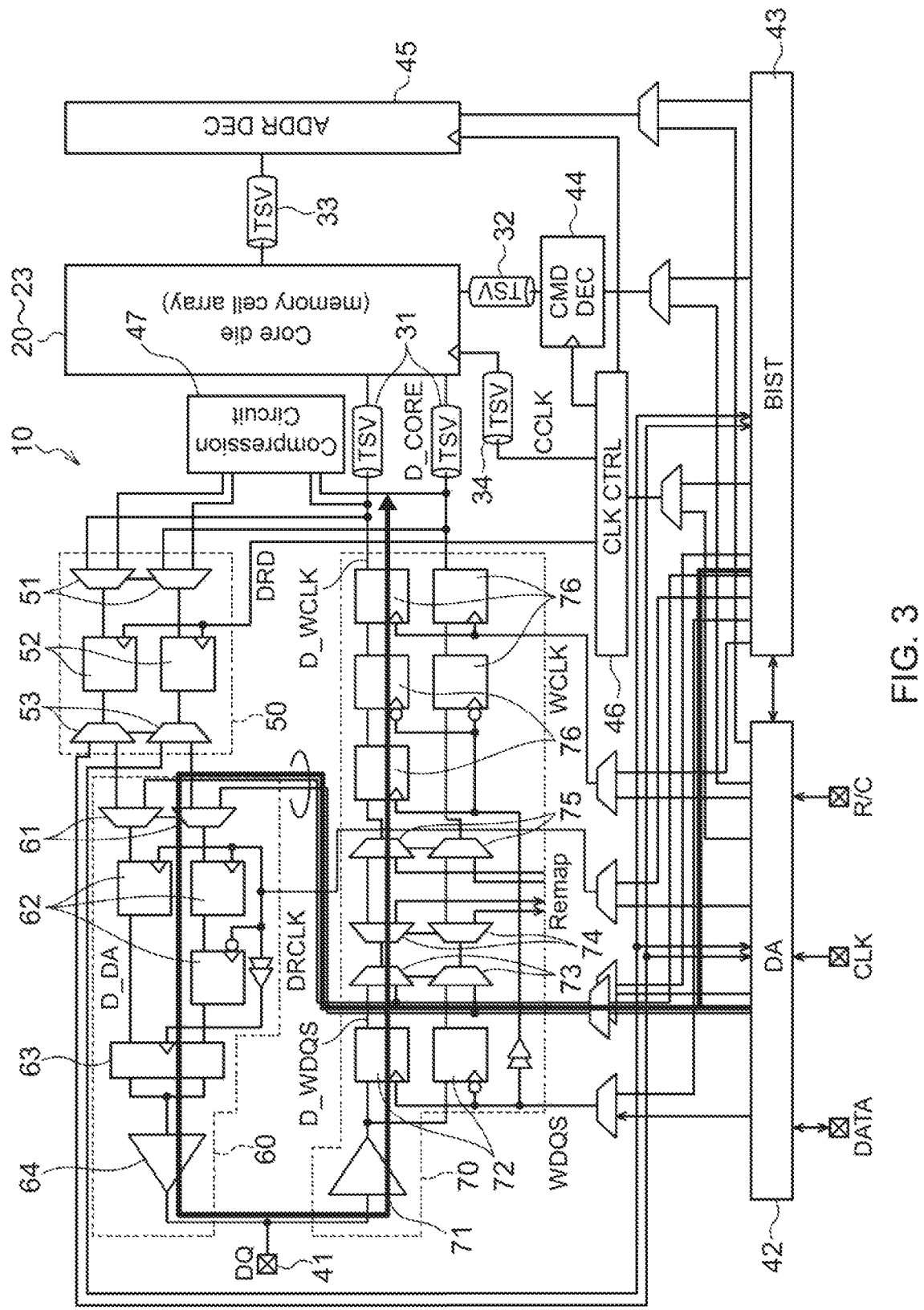
FIGS. 3 to 6 are schematic diagrams for explaining a flow of test data at the time of an operation test.

A flow of data at the time of a test operation is explained next. Because the planar size of the data input/output terminal 41 is quite small as described above, it is difficult to perform direct probing to the data input/output terminal 41 at the time of a test operation. Therefore, at the time of a test operation, probing is performed to the bump electrode 8 that is greater in the planar size, instead of probing to the data input/output terminal 41. As shown in FIG. 1, the bump electrode 8 is directly connected to the direct access terminal 42. First, in a test of a write operation, a test data input from the direct access terminal 42 or the BIST circuit 43 is supplied to the selectors 61 included in the read circuit 60 as shown in FIG. 3. In this state, the read clock signal DRCLK, the strobe signal WDQS, and the write clock signal WCLK are generated so as to activate both the read circuit 60 and the write circuit 70. Accordingly, the test data supplied from the direct access terminal 42 to the selectors 61 is written into the memory core chips 20 to 23 through the read circuit 60, the data input/output terminal 41, the write circuit 70, and the TSVs 31. At this time, because the write circuit 70 and the memory core chips 20 to 23 are simultaneously activated similarly in the normal operation, the operation test can be performed in a state where a write operation in the normal operation is reproduced more accurately. That is, the operation test can be performed under a condition that power supply noises from the write circuit 70 and the memory core chips 20 to 23 simultaneously occur. Furthermore, because the test data passes through the read circuit 60 and the write circuit 70, whether the read circuit 60 and the write circuit 70 operate normally can also be confirmed.

Figure 4:
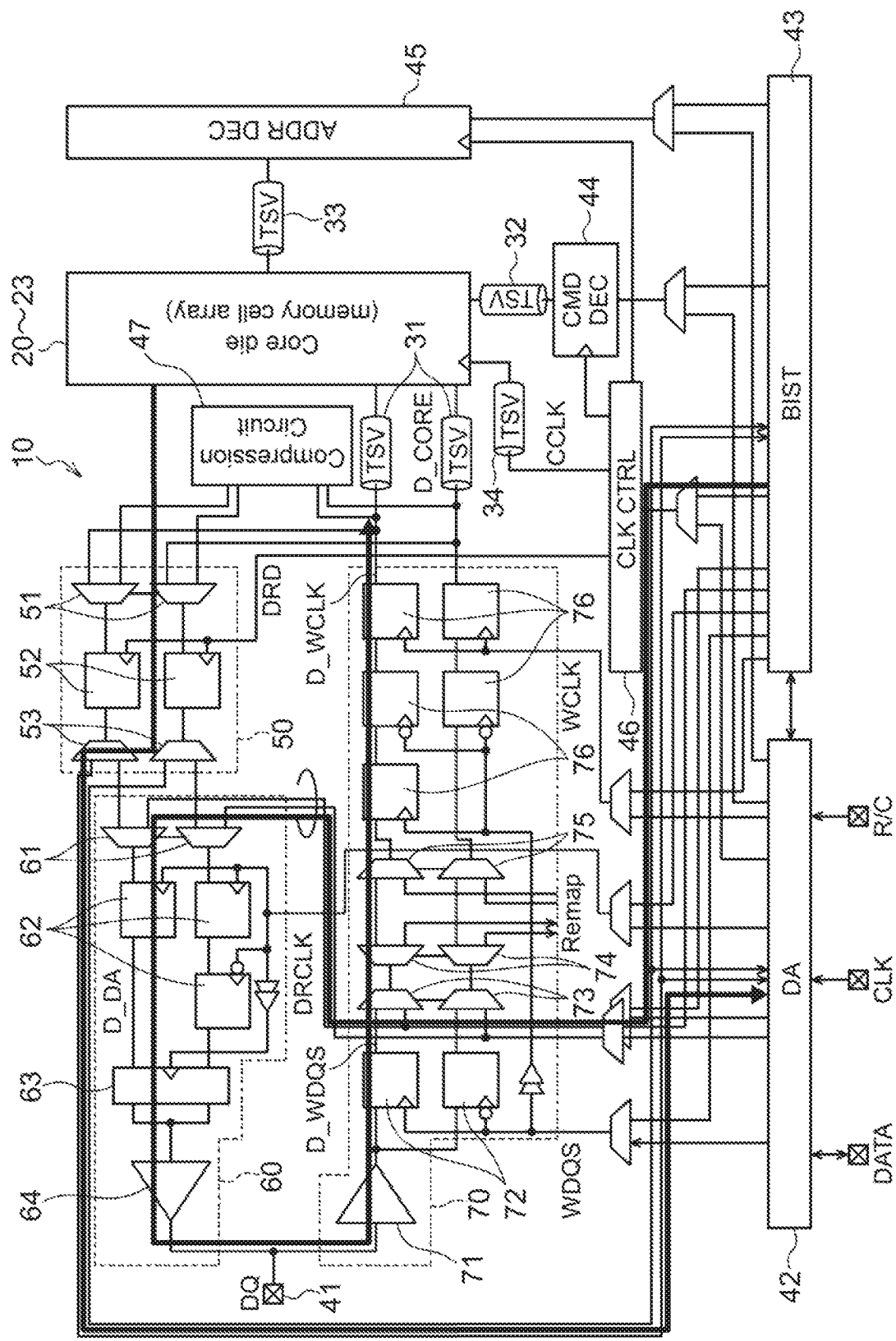

Next, in a test of a read operation, a test data read from the memory core chips 20 to 23 is supplied to the bypass circuit 50 through the TSVs 31 as shown in FIG. 4. At this time, the selectors 53 included in the bypass circuit 50) select the direct access terminal 42 as a data output destination. The read circuit 60 (and the write circuit 70) is (are) also operated by the BIST circuit 43. Accordingly, the test data read from the memory core chips 20 to 23 is externally retrieved through the direct access terminal 42 and the read circuit 60 (and the write circuit 70) also operates (operate). Therefore, the read circuit 60 and the memory core chips 20 to 23 are simultaneously activated similarly at the time of a normal operation, so that the operation test can be performed in a state where a read operation in the normal operation is reproduced more accurately. That is, the operation test can be performed under a condition that power supply noises from the read circuit 60 and the memory core chips 20 to 23 simultaneously occur. Additionally, in a case where the write circuit 70 is also operated, the test can be performed in severer environments in respect of the power supply noises. Therefore, when this test is passed, it can be said that an operation in severer environments than those of power supply noises in the normal operation has been verified.

The test data read from the direct access terminal 42 in the test of a read operation is input to a tester via the bump electrode 8 shown in FIG. 1. The tester compares the test data read from the memory core chips 20 to 23 with the test data written into the memory core chips 20 to 23 and determines whether the both test data match. The device is determined as a non-defective product when the comparison result indicates that the both test data match, and the device is determined as a defective product when the both test data do not match.

Figure 5:
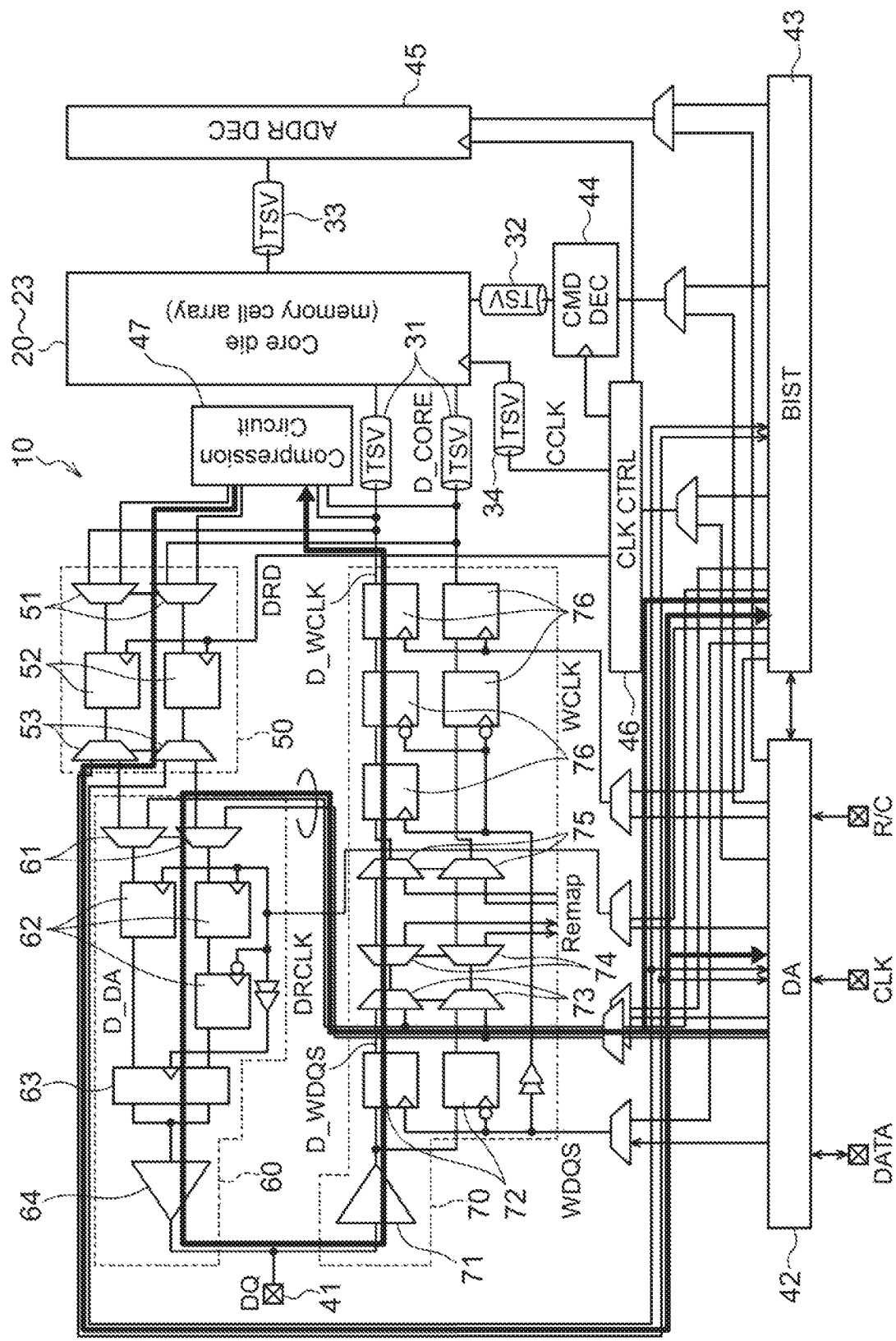

When the device is determined as a defective product, a test of the read circuit 60 and the write circuit 70 and a test of the memory core chips 20 to 23 are performed separately as required. In the test of the read circuit 60 and the write circuit 70, a test data input from the direct access terminal 42 or the BIST circuit 43 is supplied to the selectors 61 included in the read circuit 60 and the read clock signal DRCLK, the strobe signal WDQS, and the write clock WCLK are generated in this state to activate both the read circuit 60 and the write circuit 70 as shown in FIG. 5. Accordingly, the test data supplied from the direct access terminal 42 to the selectors 61 passes through the read circuit 60, the data input/output terminal 41, and the write circuit 70. The test data output from the write circuit 70 is compressed by the compression circuit 47 to generate a compression data. The compression data is transferred to the direct access terminal 42 or the BIST circuit 43 via the bypass circuit 50. Accordingly, whether the read circuit 60 and the write circuit 70 operate normally can be determined by reference to the compression data output from the direct access terminal 42 regardless of data written/read into/from the memory core chips 20 to 23.

Figure 6:
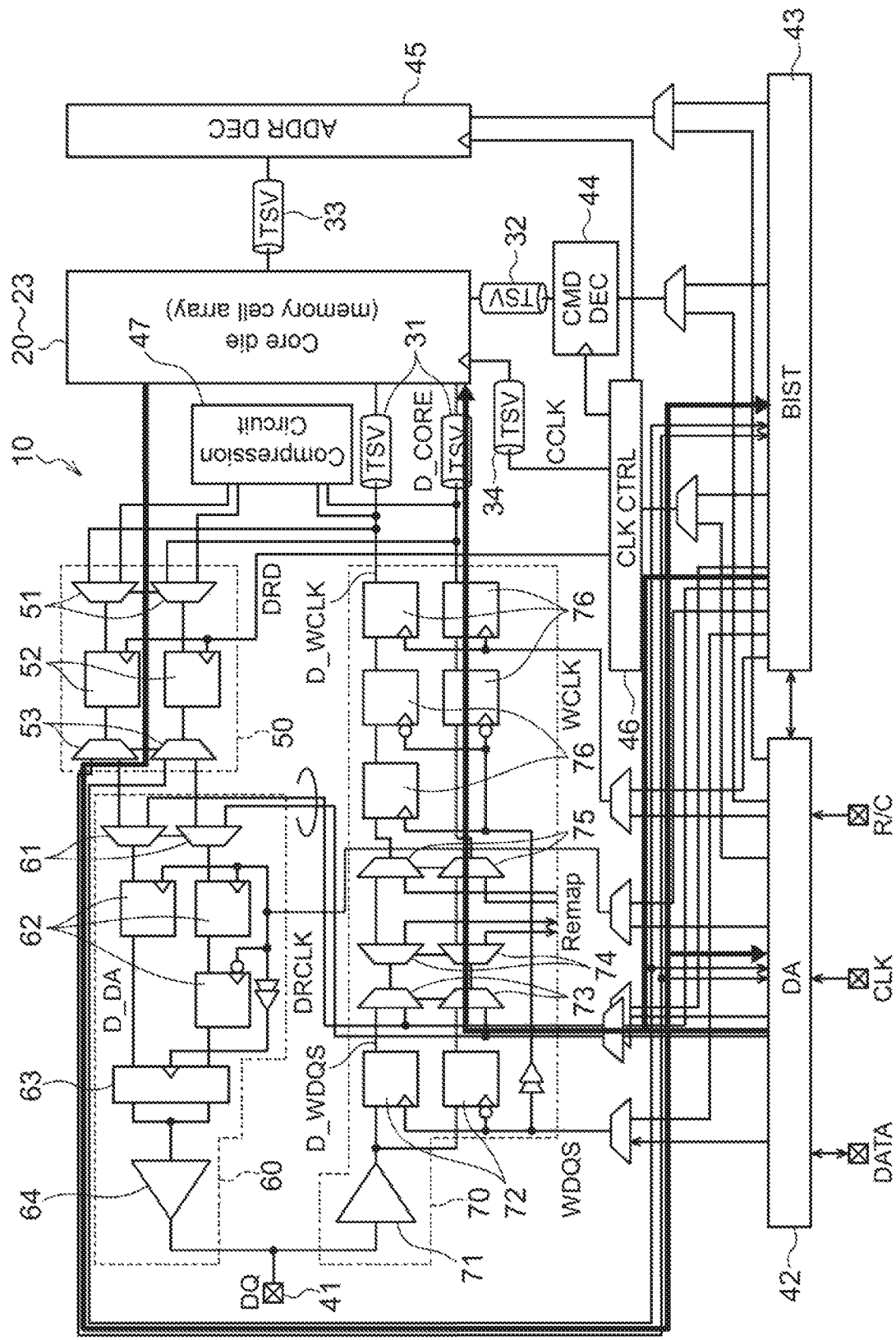

In the test of the memory core chips 20 to 23, a test data input from the direct access terminal 42 or the BIST circuit 43 is supplied to the selectors 73 included in the write circuit 70 as shown in FIG. 6. The test data supplied to the selectors 73 is written into the memory core chips 20 to 23 through the TSVs 31. Next, the test data is read from the memory core chips 20 to 23. The test data read from the memory core chips 20 to 23 is supplied to the bypass circuit 50 through the TSVs 31. The bypass circuit 50 transfers the test data directly to the direct access terminal 42 or the BIST circuit 43 without supplying the test data to the read circuit 60. In this way, the test data supplied from the direct access terminal 42 to the selectors 73 is written into the memory core chips 20 to 23 without passing through the input receiver 71 and the test data read from the memory core chips 20 to 23 is read from the direct access terminal 42 without passing through the output driver 64. The test data read from the direct access terminal 42 is input to the tester and is compared with the test data written into the memory core chips 20 to 23. In a case where the memory core chips 20 to 23 are independently tested in this way, the output driver 64 and the input receiver 71 do not operate. Therefore, when the test data written into the memory core chips 20 to 23 and the test data read from the memory core chips 20 to 23 do not match, it can be determined that there is a defect in the memory core chips 20 to 23. The present invention is not limited thereto and circuits to be operated can be variously combined according to a target to be tested. Specifically, when a defect in the memory core chips as well as the interface chip is to be checked, it suffices to operate all the memory core chips, and the read circuit and the write circuit of the interface chip. When whether the defect is included in the interface chip or the memory core chips is to be determined, it suffices to prevent the memory core chips from being operated using the compression circuit 47 as in the manner described above. Furthermore, whether the read circuit 60 and the write circuit 70 are to be used as a path of data, or whether the read circuit 60 and the write circuit 70 are to be operated as power supply noises without being used as a path of data can be freely realized by selecting a combination of circuits to be operated.

As described above, with the semiconductor device according to the present disclosure, a same operating condition as that at the time of a normal operation can be reproduced using the direct access terminal 42 and an operation test can be performed in a state where a portion to be tested among the interface chip and the memory core chips is separated.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the at based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a first semiconductor chip including a data I/O terminal, a test terminal, a first data input node, a first data output node, a read circuit configured to transfer a read data supplied from the first data input node to the data I/O terminal, a write circuit configured to transfer a write data supplied from the data I/O terminal to the first data output node, and a test circuit configured to transfer a test data supplied from the test terminal to the read circuit; and
a second semiconductor chip including a second data input node connected to the first data output node, a second data output node connected to the first data input node, and a memory cell array connected to the second data input node and the second data output node,
wherein the test circuit is configured to activate the read circuit, the write circuit and the memory cell array so that the test data is written into the memory cell array via the read circuit, the data I/O terminal, the write circuit, the first data output node, and the second data input node.

2. The apparatus of claim 1, further comprising a package substrate on which the first and second semiconductor chips are mounted,
wherein the package substrate includes an external terminal connected to the test terminal, and
wherein the external terminal is greater in size than the test terminal.

3. The apparatus of claim 2, wherein the test terminal has the same size as the data I/O terminal.

4. The apparatus of claim 1,
wherein the second semiconductor chip is stacked on the first semiconductor chip,
wherein the apparatus further comprises a first TSV connected between the first data input node and the second data output node and a second TSV connected between the first data output node and the second data input node, and
wherein each of the first and second TSVs penetrates through one of the first and second semiconductor chip.

5. The apparatus of claim 1,
wherein the first semiconductor chip further includes a bypass circuit connected between the first data input node and the read circuit, and
wherein the bypass circuit is configured to transfer the test data supplied from the data input node to the test terminal.

6. The apparatus of claim 5, wherein the test circuit is configured to control the bypass circuit so that the test data read from the memory cell array is transferred to both the test terminal and the data I/O terminal.

7. The apparatus of claim 1, wherein the test circuit is configured to activate the read circuit by supplying a read clock signal to the read circuit and activate the write circuit by supplying a write clock signal to the write circuit.

8. The apparatus of claim 1, wherein the write circuit includes a first selector configured to select one of the test data supplied from the data I/O terminal and the test data supplied from the test circuit so that the selected one of the test data is supplied to the first data output node.

9. The apparatus of claim 1, wherein the write circuit includes a second selector configured to supply the test data supplied from the data I/O terminal to one of the first data output node and the test circuit.

10. The apparatus of claim 5, wherein the test circuit includes a compression circuit configured to compress the test data on the first data output node to generate a compression data.

11. The apparatus of claim 10, wherein the bypass circuit includes a third selector configured to select one of the test data supplied from the first data input node and the compression data.

12. An apparatus comprising:
a first semiconductor chip including a data I/O terminal, a test terminal, a first data input node, read circuit configured to drive the I/O terminal, a bypass circuit configured to transfer a test data supplied from the first data input node to any of the read circuit and the test terminal, and a test circuit configured to control the bypass circuit; and
a second semiconductor chip stacked on the first semiconductor chip, the second semiconductor chip including a second data output node connected to the first data input node, and a memory cell array connected to the second data output node,
wherein the test circuit is configured to control the bypass circuit so that the test data read from the memory cell array is transferred to both the data I/O terminal via the read circuit and the test terminal by bypassing the read circuit.

13. The apparatus of claim 12, further comprising a package substrate on which the first and second semiconductor chips are mounted,
wherein the package substrate includes an external terminal connected to the test terminal, and
wherein the external terminal is greater in size than the test terminal.

14. The apparatus of claim 13, wherein the test terminal has the same size as the data I/O terminal.

15. The apparatus of claim 12, further comprising a TSV connected between the first data output node and the second data input node,
wherein the TSV penetrates through one of the first and second semiconductor chip.

16. The apparatus of claim 12,
wherein the first semiconductor chip further includes a first output node and a write circuit connected between the data I/O terminal and the first output node,
wherein the second semiconductor chip further includes a second data input node connected to the first output node, and
wherein the test circuit is configured to activate the read circuit, the write circuit and the memory cell array so that the test data is written into the memory cell array via the read circuit, the data I/O terminal, the write circuit, the first data output node, and the second data input node.

17. An apparatus comprising:
first, second, third, and fourth external terminals;
an output driver circuit having an input node and an output node connected to the first external terminal;
an input receiver circuit having an input node connected to the first external terminal and an output node connected to the second external terminal;
a first selector circuit having an input node connected to the third external terminal, a first output node connected to the fourth external terminal, and a second output node;
a second selector circuit having a first input node connected to the second output node of the first selector circuit, a second input node connected to the fourth external terminal, and an output node connected to the input node of the output driver; and
a test circuit configured to control the first and second selector circuits,
wherein the test circuit is configured to control the first selector circuit to connect the input node thereof to both the first and second output nodes thereof and control the second selector circuit to connect the first input node thereof to the output node thereof in a read test mode so that a read test data supplied from the third external terminal is transferred to both the first and fourth external terminals, and
wherein the test circuit is configured to control the second selector circuit to connect the second input node thereof to the output node thereof in a write test mode so that a write test data supplied from the fourth external terminals is transferred to the second external terminals via the output driver circuit and the input receiver circuit.

18. The apparatus of claim 17,
wherein the first external terminal is a data I/O terminal,
wherein the second external terminal is a data output terminal,
wherein the third external terminal is a data input terminal, and
wherein the fourth external terminal is a direct access terminal.

19. The apparatus of claim 18, further comprising a memory core chip having a data write terminal connected to the second external terminal and a data read terminal connected to the third external terminal.

20. The apparatus of claim 19, further comprising an interposer connected to the first and fourth external terminals.

\* \* \* \* \*